(12) United States Patent
Hsu et al.

(10) Patent No.: US 11,222,859 B2
(45) Date of Patent: Jan. 11, 2022

(54) SEMICONDUCTOR DEVICE STRUCTURE WITH BONDING PAD AND METHOD FOR FORMING THE SAME

(71) Applicant: Taiwan Semiconductor Manufacturing Co., Ltd., Hsinchu (TW)

(72) Inventors: Chien-Hao Hsu, Zhubei (TW); Wei-Hsiang Tu, Hsinchu (TW); Kuo-Chin Chang, Chiayi (TW); Mirng-Ji Lii, Sinpu Township, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/866,828

(22) Filed: May 5, 2020

(65) Prior Publication Data

US 2021/0351144 A1    Nov. 11, 2021

(51) Int. Cl.
*H01L 23/495* (2006.01)
*H01L 23/522* (2006.01)
(Continued)

(52) U.S. Cl.
CPC .............. *H01L 24/05* (2013.01); *H01L 24/03* (2013.01); *H01L 24/13* (2013.01); *H01L 28/60* (2013.01); *H01L 2224/0391* (2013.01); *H01L 2224/03614* (2013.01); *H01L 2224/0401* (2013.01); *H01L 2224/05017* (2013.01); *H01L 2224/05083* (2013.01); *H01L 2224/05124* (2013.01); *H01L 2224/05147* (2013.01); *H01L 2224/05166* (2013.01); *H01L 2224/05181* (2013.01); *H01L 2224/05184* (2013.01); *H01L 2224/13026* (2013.01); *H01L 2224/13082* (2013.01);
(Continued)

(58) Field of Classification Search
CPC ... H01L 2224/0401; H01L 2224/05083; H01L 28/60
See application file for complete search history.

(56) References Cited

U.S. PATENT DOCUMENTS 6,198,123 B1 * 3/2001 Linder .................... H01L 28/40
257/298
8,993,380 B2    3/2015 Hou et al.
(Continued)

FOREIGN PATENT DOCUMENTS

TW    200828572 A    7/2008

*Primary Examiner* — Dale E Page
*Assistant Examiner* — Wilner Jean Baptiste
(74) *Attorney, Agent, or Firm* — Birch, Stewart, Kolasch & Birch, LLP

(57) ABSTRACT

A semiconductor device structure and method for forming the same are provided. The semiconductor device structure includes a first insulating layer formed over a conductive feature and a capacitor structure embedded in the first insulating layer. The semiconductor device also includes a bonding pad formed over the first insulating layer and corresponding to the capacitor structure. The bonding pad has a top surface and a multi-step edge to form at least three corners. In addition, the semiconductor device structure includes a second insulating layer conformally covering the at least three corners formed by the top surface and the multi-step edge of the bonding pad.

20 Claims, 10 Drawing Sheets

(51) Int. Cl.
  *H01L 23/00* (2006.01)
  *H01L 49/02* (2006.01)
(52) U.S. Cl.
  CPC ........... *H01L 2224/13111* (2013.01); *H01L 2224/13116* (2013.01); *H01L 2224/13124* (2013.01); *H01L 2224/13139* (2013.01); *H01L 2224/13147* (2013.01); *H01L 2224/13155* (2013.01); *H01L 2224/13211* (2013.01); *H01L 2224/13239* (2013.01); *H01L 2224/13247* (2013.01); *H01L 2924/014* (2013.01); *H01L 2924/19041* (2013.01); *H01L 2924/19104* (2013.01)

(56) References Cited

U.S. PATENT DOCUMENTS

| | | |
|---|---|---|
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2013/0270676 A1* | 10/2013 | Lindert ............... H01L 27/108 257/532 |
| 2017/0229421 A1 | 8/2017 | Tseng |
| 2018/0277624 A1 | 9/2018 | Schultz |

* cited by examiner

SEMICONDUCTOR DEVICE STRUCTURE WITH BONDING PAD AND METHOD FOR FORMING THE SAME

BACKGROUND

With the advancement of electronic technology, electronic equipment has become more complicated and involves a greater amount of integrated circuitry to achieve the desired multi-functionality. Thus, the manufacturing of such electronic equipment includes more and more operations, as well as various kinds of materials, in order to produce semiconductor devices for use in the electronic equipment.

Semiconductor devices may include active and/or passive devices such as transistors and capacitors. These devices are initially isolated from each other, but are later interconnected together. Typical interconnect structures include lateral interconnections, such as metal lines (wirings), and vertical interconnections, such as vias and contacts. On top of the interconnect structures, bonding pads are formed and exposed on the surface of the respective chip. Electrical connections are made through bonding pads to connect the chip to another element.

During the manufacturing operations, the semiconductor device is assembled with a number of components that include various materials. As more components with different materials are involved, and the complexity of the manufacturing operations increases, more challenges arise to modify a structure of the semiconductor device and improve the manufacturing operations.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
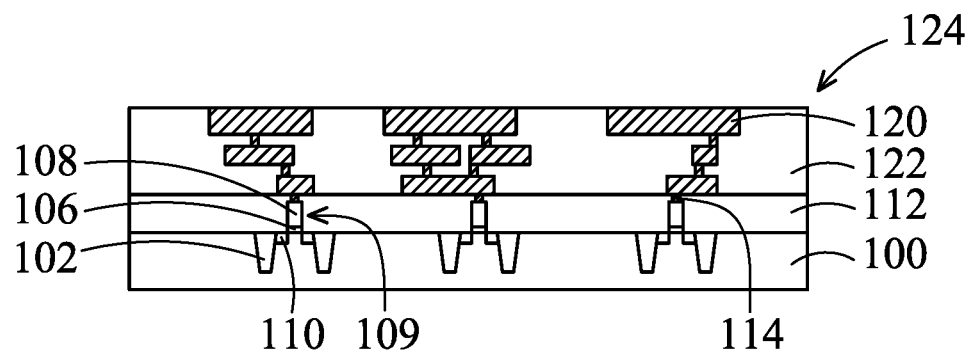
FIGS. 1A-1K show cross-sectional representations of various stages of forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±5% of that numerical value. For example, two numerical values can be deemed to be "substantially" the same or equal if a difference between the values is less than or equal to ±5% of an average of the values.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments for manufacturing semiconductor device structures are provided. The semiconductor device structures may include a bonding pad formed between an underlying first insulating layer and an overlying second insulating layer. A capacitor structure, such as a metal-insulator-metal (MIM) capacitor, is embedded in the first insulating layer and corresponds to the bonding pad. The bonding pad has a multi-step edge or a sidewall with a non-straight contour. As a result, the path from the top surface of the bonding pad to the top surface of the first insulating layer along the multi-step edge or the sidewall with the non-straight contour of the bonding pad includes at least three corners to define three turning angles. The sum of the turning angles is greater than 90°. The formation of such as a bonding pad includes patterning a conductive layer by at least a first etching process using a first masking layer and a second etching process using a second masking layer. The first masking layer has an area greater than that of the second masking layer. Such a bonding pad provides more surface area than a bonding pad without a multi-step edge to share the stress in the second insulating layer. As a result, the bonding pad with the multi-step edge can be used as a stress buffer or a crack-stopper to prevent cracks from expanding or penetrating into the capacitor structure below the bonding pad. Therefore, the quality, yield, and reliability of the semiconductor device structure are improved.

Embodiments for a semiconductor device structure and method for forming the same are provided. FIGS. 1A-1K show cross-sectional representations of various stages of forming a semiconductor device structure 200, in accordance with some embodiments. In some embodiments, the semiconductor device structure 200 includes a capacitor structure (such as a metal-insulator-metal (MIM) capacitor) formed over a conductive feature (such as the uppermost metal layer that is also referred to as the top metal layer of an interconnect structure). A bonding pad having a top surface and a multi-step edge (or a sidewall with a non-straight contour) is formed over the MIM capacitor to prevent cracks from extending into the capacitor structure. The top surface and the multi-step edge of the bonding pad form at least three corners to correspondingly define at least three turning angles at the multi-step edge.

In some embodiments, a substrate 100, such as a device wafer is provided, as shown in FIG. 1A. The features are formed over the top surface of substrate 100. The substrate 100 may be made of silicon or other semiconductor materials. Alternatively or additionally, the substrate 100 may include other elementary semiconductor materials such as germanium. In some embodiments, the substrate 100 is made of a compound semiconductor such as silicon carbide, gallium arsenic, indium arsenide, or indium phosphide. In some embodiments, the substrate 100 is made of an alloy semiconductor such as silicon germanium, silicon germanium carbide, gallium arsenic phosphide, or gallium indium phosphide. In some embodiments, the substrate 100 includes an epitaxial layer. For example, the substrate 100 has an epitaxial layer overlying a bulk semiconductor.

As shown in FIG. 1A, an isolation structure 102, such as shallow trench isolation (STI) structures is formed in the substrate 100 to isolate the active regions in the substrate 100. Although not shown, through-vias may be formed to extend into substrate 100. The through-vias are used to electrically couple the features on the opposite sides of substrate 100.

An insulating layer 112 and gate structures 109 embedded in the insulating layer 112 are formed over the top surface of the substrate 100, as shown in FIG. 1A. The gate structure 109 may include a gate dielectric layer 106 and a gate electrode layer 108 formed over the gate dielectric layer 106. A source/drain structure 110 is formed in the substrate 100 and next to the corresponding gate structure 109 prior to the formation of the insulating layer 112 and after the gate structures 109 are formed. Afterwards, contact structures 114 (such as contact plugs) are formed over and electrically coupled to the gate structures 109, respectively.

In some embodiments, the insulating layer 112 is an inter-layer dielectric (ILD) layer that is formed over the substrate 100 and fills the space between the gate stacks of transistors (not shown) in integrated circuit devices 26. In some embodiments, the insulating layer 112 is formed of phospho silicate glass (PSG), boro silicate glass (BSG), boron-doped phospho silicate glass (BPSG), fluorine-doped silicate glass (FSG), tetraethoxysilane (TEOS) oxide, or the like. The insulating layer 112 may be formed by spin-on coating, flowable chemical vapor deposition (FCVD), plasma enhanced chemical vapor deposition (PECVD), low pressure chemical vapor deposition (LPCVD), or the like.

The contact structures 114 formed in the insulating layer 112 are also used to electrically connect the gate structures 109 to overlying metal lines and vias. In some embodiments, contact structures 114 are formed of a conductive material, such as tungsten, aluminum, copper, titanium, tantalum, titanium nitride, tantalum nitride, or alloys thereof. The formation of the contact structures 114 may include forming contact openings in the insulating layer 112, filling a conductive material into the contact openings, and performing a planarization process (such as a chemical mechanical polishing (CMP) process or a mechanical grinding process) to level the top surfaces of the contact structures 114 with the top surface of the insulating layer 112.

After the contact structures 114 are formed, an interconnect structure 124 is formed over the insulating layer 112. The interconnect structure 124 may be used as a redistribution (RDL) structure for routing. The interconnect structure 124 includes multiple metal lines and vias formed in multiple dielectric layers 122 (also referred to as inter-metal dielectric (IMD) layers). The metal lines at the same level are collectively referred to as a metal layer hereinafter. In some embodiments, the interconnect structure 124 has metal layers that include the uppermost metal layer 120, and which are interconnected through vias. The metal layers and vias may be formed of copper or copper alloys, but they can also be formed of other metals. In some embodiments, the multiple dielectric layers 122 are formed of silicon oxide, silicon carbide, silicon nitride, silicon oxynitride, or low-k dielectric materials. The dielectric constants (k values) of the low-k dielectric materials may include a carbon-containing low-k dielectric material, hydrogen silsesquioxane (HSQ), methylsilsesquioxane (MSQ), or the like. The formation of the multiple dielectric layers 122 may be the same as or similar to the method used to form the insulating layer 112.

The formation of metal layers and vias may include single damascene processes and/or dual damascene processes. In a single damascene process, trenches are first formed in one of the multiple dielectric layers 122, followed by filling the trenches with a conductive material. A planarization process such as a CMP process or a mechanical grinding process is then performed to remove any excess portions of the conductive material that is higher than the top surface of the respective IMD layer, leaving a metal layer in the trenches. In a dual damascene process, both trench and via openings are formed in an IMD layer, with the via opening underlying and connected to the corresponding trench. The conductive material is then filled into the trenches and the via openings to form a metal layer and vias. The conductive material may include a diffusion barrier layer and a metal material over the diffusion barrier layer. The metal material may be made of copper (Cu), copper alloy, aluminum (Al), aluminum alloy, tungsten (W), tungsten alloy, titanium (Ti), titanium alloy, tantalum (Ta) or tantalum alloy. The metal layers and vias may be formed by electroplating, electroless plating, printing, CVD process, or physical vapor deposition (PVD). The diffusion barrier layer may include titanium, titanium nitride, tantalum, tantalum nitride, or the like.

Figure 1B:
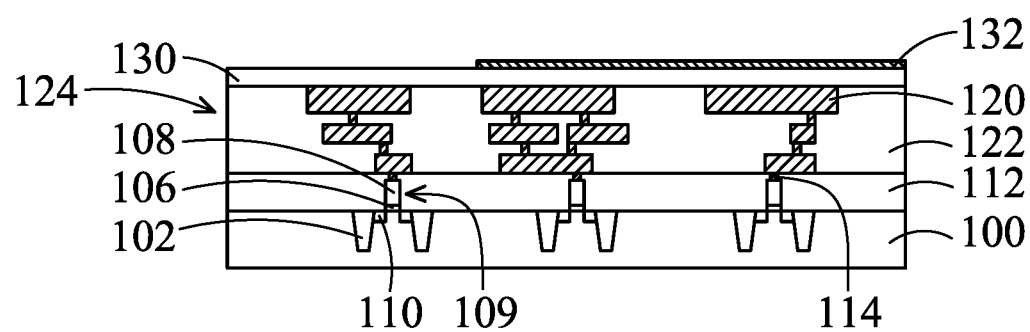
Figure 1C:
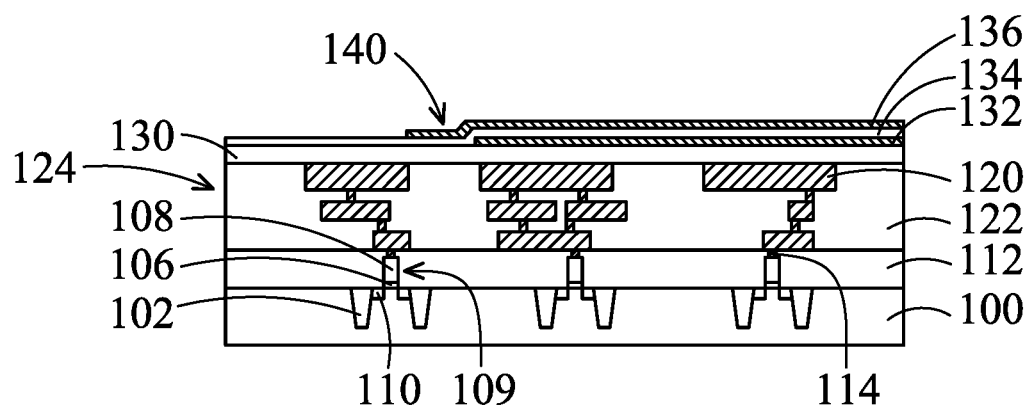

After the interconnect structure 124 is formed, a capacitor structure is formed over the interconnect structure 124, as shown in FIGS. 1B and 1C in accordance with some embodiments.

In some embodiments, an optional etching stop layer (not shown) is formed over the interconnect structure 124, and an insulating layer 130 is formed over the etching stop layer, in accordance with some embodiments. Afterwards, a capacitor metal electrode layer 132 is formed over the insulating layer 130, as shown in FIG. 1B in accordance with some embodiments. The etching stop layer may be made of silicon carbide (SiC), silicon nitride ($Si_xN_y$), silicon carbonitride (SiCN), silicon oxycarbide (SiOC), silicon oxycarbon nitride (SiOCN), or another applicable material. The etching stop layer may be formed by a deposition process, such as CVD, PVD, atomic layer deposition (ALD), or another applicable process. Moreover, the insulating layer 130 may be made of undoped silicate glass (USG), silicon oxide, or another applicable material. The insulating layer 130 may be formed by a deposition process, such as CVD, PVD, ALD, or another applicable process.

The capacitor metal electrode layer 132 is made of a conductive material, such as titanium (Ti), titanium nitride (TiN), tantalum (Ta), tantalum nitride (TaN), copper (Cu), copper alloy, aluminum (Al), aluminum (Al) alloy, copper aluminum alloy (AlCu), tungsten (W) or tungsten (W) alloy or another applicable material.

The formation of the capacitor metal electrode layer 132 includes deposition, photolithography, and etching processes. The deposition processes include CVD, PVD, ALD, or applicable process. The photolithography processes include photoresist coating (e.g., spin-on coating), soft baking, mask aligning, exposure, post-exposure baking, developing photoresist, rinsing and drying (e.g., hard baking). The etching process includes a dry etching process or a wet etching process.

In some embodiments, after the photolithography processes, a cleaning process is performed to remove some residue remaining on the capacitor metal electrode layer 132.

Afterwards, a capacitor insulating layer 134 is formed over the capacitor metal electrode layer 132, and a capacitor metal electrode layer 136 is formed over the capacitor insulating layer 134, as shown in FIG. 1C in accordance with some embodiments of the disclosure. In some embodiments, the capacitor metal electrode layer 136 and the underlying capacitor insulating layer 134 are Z-shaped. The capacitor metal electrode layer 136 and the underlying capacitor insulating layer 134 each have a lower horizontal portion, an upper horizontal portion, and a vertical portion. The vertical portion extends between the lower horizontal portion and the upper horizontal portion, as shown in FIG. 1C. The capacitor structure includes the capacitor metal electrode layer 132, the capacitor insulating layer 134, and the capacitor metal electrode layer 136 to form a metal-insulator-metal (MIM) capacitor 140. The capacitor metal electrode layer 132 is a bottom electrode of the MIM capacitor 140, and the capacitor metal electrode layer 136 is the top electrode of the MIM capacitor 140. Although not shown, the MIM capacitor 140 may be electrically connected to the uppermost metal layer 120 of the interconnect structure 124 through one or more vias.

In some embodiments, the capacitor insulating layer 134 is made of high-k dielectric material. In some embodiments, the high-k dielectric material has a dielectric constant (k value) that is not lower than 4. For example, the high-k dielectric material may include zirconium dioxide ($ZrO_2$), aluminum oxide ($Al_2O_3$), titanium oxide ($Ti_xO_y$, wherein x is a real number and y is a real number), tantalum oxide ($Ta_xO_y$, wherein x is a real number and y is a real number), titanium oxide nitride ($Ti_xO_yN_z$, wherein x is a real number, y is a real number and z is a real number) or tantalum oxide nitride ($Ta_xO_yN_x$, wherein x is a real number, y is a real number and z is a real number). In some other embodiments, the capacitor insulating layer 134 is a $ZrO_2$—$Al_2O_3$—$ZrO_2$ (ZAZ) laminate layer.

The capacitor metal electrode layer 136 is made of a conductive material, such as titanium (Ti), titanium nitride (TiN), tantalum (Ta), tantalum nitride (TaN), copper (Cu), copper alloy, aluminum (Al), aluminum (Al) alloy, copper aluminum alloy (AlCu), tungsten (W) or tungsten (W) alloy or another applicable material.

Figure 1D:
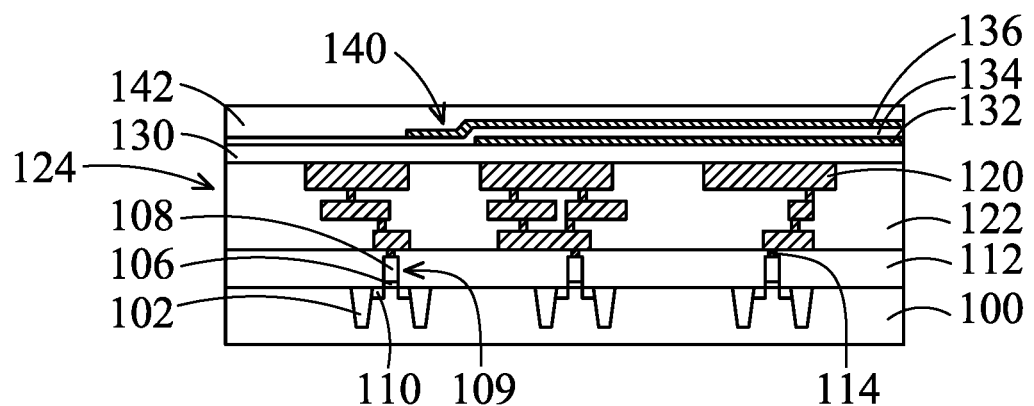

Afterwards, an insulating layer 142 is formed over the MIM capacitor 140, as shown in FIG. 1D in accordance with some embodiments. In some embodiments, the material and the method used for formation of the insulating layer 142 are the same as or similar to those used for formation of the insulating layer 130. These two insulating layers 130 and 142 are sometimes collectively referred to as a passivation layer. Therefore, the MIM capacitor 140 is embedded in the passivation layer that includes insulating layers 130 and 142.

Figure 1E:
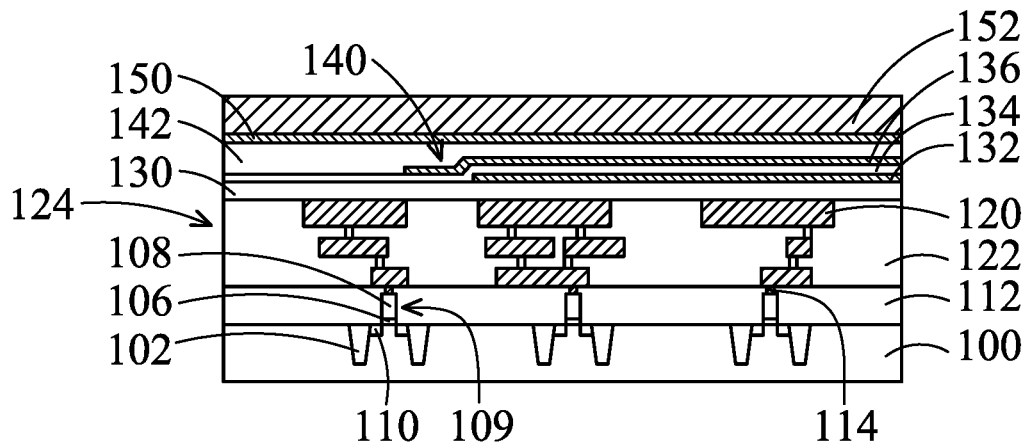
Figure 1F:
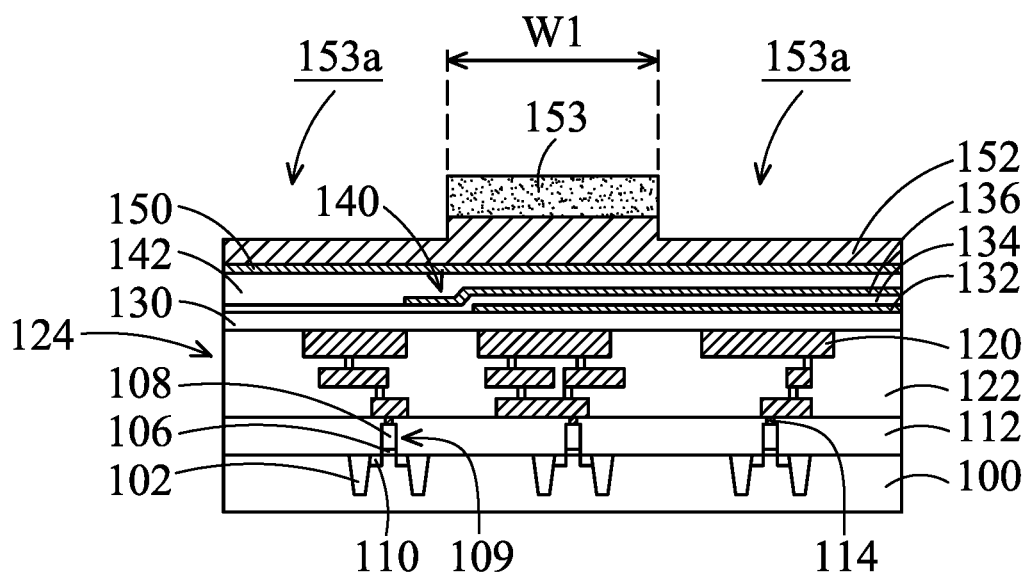
Figure 1G:
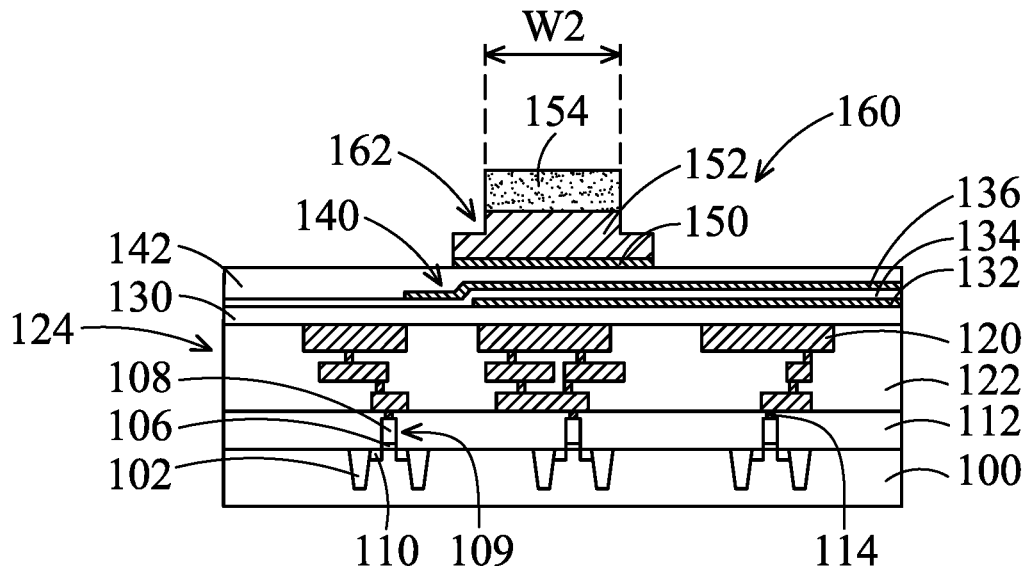

After the formation of a passivation layer that includes insulating layers 130 and 142, a bonding pad 160 is formed over the passivation layer and corresponding to the capacitor structure (e.g., the MIM capacitor 140), as shown in FIGS. 1E to 1G in accordance with some embodiments. More specifically, an adhesion layer 150 is formed over the insulating layer 142 of the passivation layer, and a conductive layer 152 is formed over the adhesion layer 150 for the formation of the subsequent bonding pad 160, as shown in FIG. 1E. In some embodiments, the adhesion layer 150 also serves as a diffusion barrier layer when the conductive layer 152 is made of a copper-containing material. In some other embodiments, the adhesion layer 150 serves as a seed layer when the conductive layer 152 is formed by a plating process.

The adhesion layer 150 may be made of a metal material, such as titanium (Ti), titanium alloy, titanium nitride (TiN), tantalum (Ta), tantalum alloy, tantalum nitride (TaN), or another applicable metal material. Moreover, the adhesion layer 150 may be formed by a deposition process, such as sputtering, plating, CVD, PVD, ALD, or another applicable process.

The conductive layer 152 may be made of a metal material, such as aluminum (Al), copper (Cu), aluminum-copper (AlCu), or another applicable metal material. Moreover, the conductive layer 152 may be formed by a deposition process, such as sputtering, CVD, PVD, ALD, or another applicable process.

Afterwards, in some embodiments, the conductive layer 152 is patterned to form recesses 153a on both sides of a pad region (not shown) of the conductive layer 152, as shown in FIG. 1F. More specifically, the recesses 153a are formed in the conductive layer 152 by photolithography, and etching processes, in accordance with some embodiments. After the photolithography process, a patterned masking layer 153 (such as a photoresist) with a width W1 is formed over the conductive layer 152 and directly above the pad region of the conductive layer 152. Afterwards, the conductive layer 152 is partially removed by the etching process (e.g., a dry etching process) using the patterned masking layer 153 as an etch mask. As a result, a portion of the conductive layer 152 uncovered by the patterned masking layer 153 is removed to form the recesses 153a. Therefore, the conductive layer 152 corresponding to the pad region has a top surface that is higher than the bottom of the recesses 153a.

After the recesses 153a are formed, the patterned masking layer 153 is removed. Afterwards, in some embodiments, the remaining conductive layer 152 is patterned again to form the bonding pad 160, as shown in FIG. 1G. More specifically, the bonding pad 160 is formed by photolithography, and etching processes, in accordance with some embodiments. After the photolithography process, a patterned masking layer 154 (such as a photoresist) with a width W2 is formed over the conductive layer 152. In some embodiments, the width W2 of patterned masking layer 154 is less than the width W1 of the patterned masking layer 153, so that the area of the patterned masking layer 154 is less than that of the patterned masking layer 153 (shown in FIG. 1F). Afterwards, the conductive layer 152 and the underlying adhesion layer 150 is partially removed by the etching process (e.g., a dry etching process) using the patterned masking layer 154 as an etch mask. As a result, a portion of the conductive layer 152 and a portion of the adhesion layer 150 are successively removed to expose the top surface of the insulating layer 142 and form the bonding pad 160 that includes the remaining conductive layer 152 and the remaining adhesion layer 150. Although not shown, the bonding pad 160 may be electrically connected to the MIM capacitor 140 and/or the uppermost metal layer 120 of the interconnect structure 124 through one or more vias.

As shown in FIG. 1G, since the area of the patterned masking layer 154 is less than that of the patterned masking layer 153, the formed bonding pad 160 has a multi-step edge (or a sidewall with a non-straight contour) 162. The patterned masking layer 154 will be removed in subsequent processes.

Figure 3:
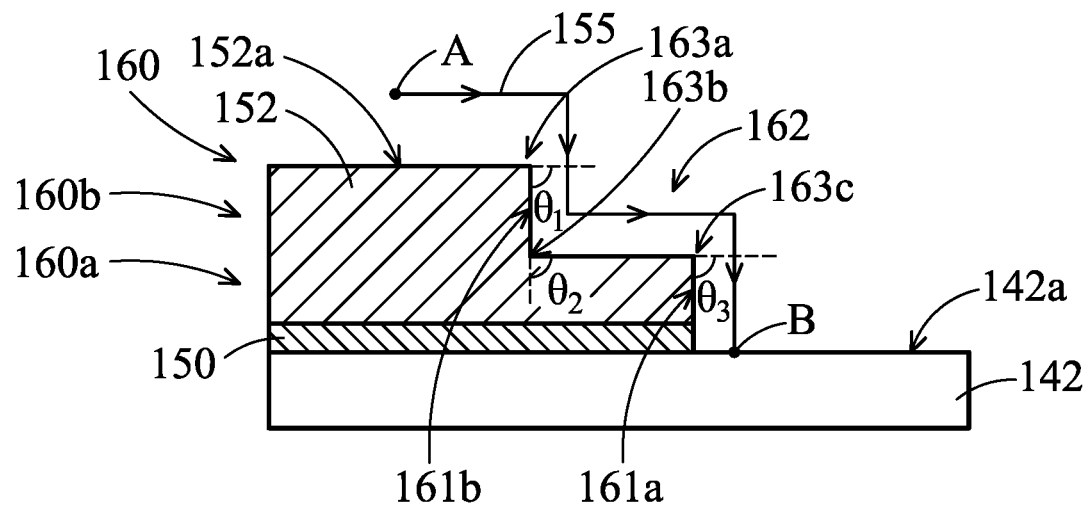
FIG. 3 shows a magnified cross-sectional representation of a portion of a bonding pad, in accordance with some embodiments.

FIG. 3 shows a magnified cross-sectional representation of a portion of the bonding pad 160 shown in FIG. 1G, in accordance with some embodiments. More specifically, the multi-step edge (or referred to as the sidewall with a non-straight contour) 162 of the bonding pad 160 defines a first step 160a and a second step 160b over the first step 160a. In some embodiments, the first step 160a has a substantially vertical sidewall 161a, and the second step 160b has a substantially vertical sidewall 161b. In some other embodiments, the substantially vertical sidewalls 161a and 161b are substantially perpendicular to the top surface 142a of the insulating layer 142.

In those cases, the path 155 from the top surface 152a of the bonding pad 160 (as indicated by point A) to the top surface 142a of the insulating layer 142 (as indicated by point B) along the sidewall with the non-straight contour (i.e., the multi-step edge) 162 of the bonding pad 160 includes three corners 163a, 163b, and 163c. In other words, the top surface 152a and the sidewall with the non-straight contour (i.e., the multi-step edge) 162 of the bonding pad 160 include three corners 163a, 163b, and 163c. Those corners 163a, 163b, and 163c define three turning angles θ1, θ2, and θ3, respectively. The turning angle θ1 is an angle between the substantially vertical sidewall 161b and the extending direction along the top surface of the second step 160b. The turning angle θ2 is an angle between the extending direction along the substantially vertical sidewall 161b and the top surface of the first step 160a. The turning angle θ3 is an angle between the substantially vertical sidewall 161a and the extending direction along the top surface of the first step 160a. The sum of the turning angles 163a, 163b, and 163c is greater than 90°. In the embodiment shown in FIG. 3, since the first step 160a has a substantially vertical sidewall 161a and the second step 160b has a substantially vertical sidewall 161b, each of the turning angles 163a, 163b, and 163c is substantially equal to 90°.

Figure 4:
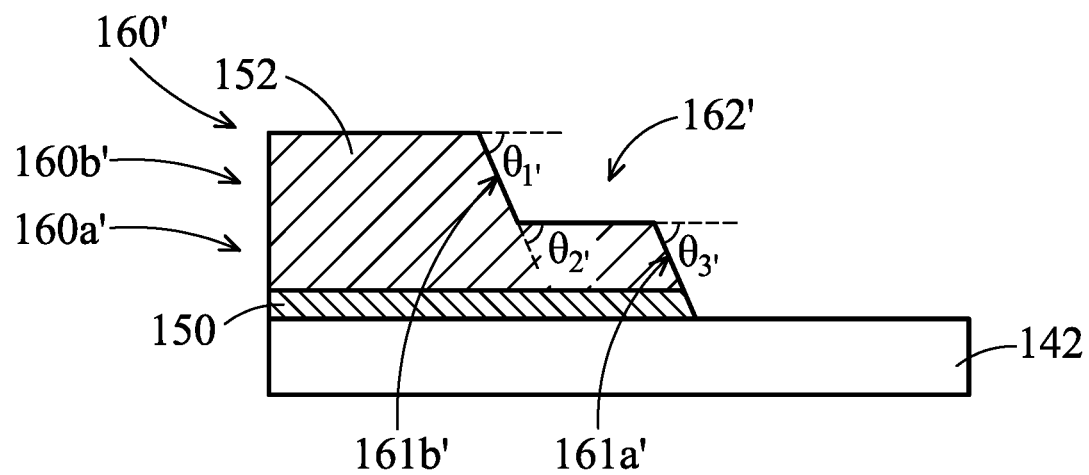
FIG. 4 shows a magnified cross-sectional representation of a portion of a bonding pad, in accordance with some embodiments.

FIG. 4 shows a magnified cross-sectional representation of a portion of the bonding pad 160', in accordance with some embodiments. In some embodiments, the bonding pad 160 shown in FIG. 1G can be replaced by the bonding pad 160' shown in FIG. 4. In some embodiments, the structure and the method used for the formation of the bonding pad 160' are similar to those used for the formation of the bonding pad 160 shown in FIG. 1G. Similar to the bonding pad 160, the multi-step edge (or referred to as the sidewall with a non-straight contour) 162' of the bonding pad 160' defines a first step 160a' and a second step 160b' over the first step 160a'. In some embodiments, the first step 160a' has a tapered (or tilted) sidewall 161a', and the second step 160b' has a tapered (or tilted) sidewall 161b'.

In those cases, the path (not shown but similar to the path 155 shown in FIG. 3) from the top surface of the bonding pad 160' to the top surface of the insulating layer 142 along the sidewall with the non-straight contour (i.e., the multi-step edge) 162' of the bonding pad 160' includes three corners. Those corners define three turning angles θ1', θ2', and θ3'. The turning angle θ1' is an angle between the tapered (or tilted) sidewall 161b' and the extending direction along the top surface of the second step 160b'. The turning angle θ2' is an angle between the extending direction along the tapered (or tilted) sidewall 161b' and the top surface of the first step 160a'. The turning angle θ3' is an angle between the tapered (or tilted) sidewall 161a and the extending direction along the top surface of the first step 160a'. The sum of the turning angles θ1', θ2', and θ3' is greater than 90°. In the embodiment shown in FIG. 4, since the first step 160a' has a tapered sidewall 161a' and the second step 160b' has a tapered sidewall 161b', each of the turning angles θ1', θ2', and θ3' is less than 90°.

Figure 5:
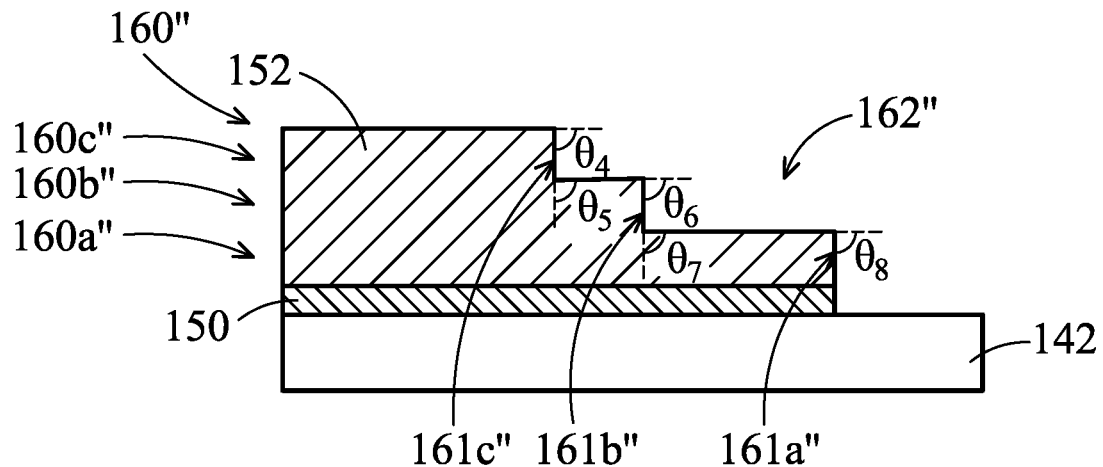
FIG. 5 shows a magnified cross-sectional representation of a portion of a bonding pad, in accordance with some embodiments.

FIG. 5 shows a magnified cross-sectional representation of a portion of the bonding pad 160", in accordance with some embodiments. In some embodiments, the bonding pad 160 shown in FIG. 1G can be replaced by the bonding pad 160" shown in FIG. 5. In some embodiments, the structure and the method used for the formation of the bonding pad 160" are similar to those used for the formation of the bonding pad 160 shown in FIG. 1G. Similar to the bonding pad 160, the multi-step edge (or referred to as the sidewall with a non-straight contour) 162" of the bonding pad 160" defines a first step 160a", a second step 160b" over the first step 160a", and a third step 160c" over the second step 160b". In some embodiments, similar to the bonding pad 160 shown in FIG. 3, the first step 160a" has a substantially vertical sidewall 161a", the second step 160b" has a substantially vertical sidewall 161b" and the third step 160c" has a substantially vertical sidewall 161c".

In those cases, the path (not shown and similar to the path 155 shown in FIG. 3) from the top surface of the bonding pad 160" to the top surface of the insulating layer 142 along the sidewall with the non-straight contour (i.e., the multi-step edge) 162" of the bonding pad 160" includes five corners. Those corners define five turning angles θ4, θ5, θ6, θ7, and θ8. The turning angle θ4 is an angle between the substantially vertical sidewall 161c" and the extending direction along the top surface of the third step 160c". The turning angle θ5 is an angle between the extending direction along the substantially vertical sidewall 161c" and the top surface of the second step 160b". The turning angle θ6 is an angle between the the substantially vertical sidewall 161b" and the extending direction along the top surface of the second step 160b". The turning angle θ7 is an angle between the extending direction along the substantially vertical sidewall 161b" and the top surface of the first step 160a". The turning angle θ8 is an angle between the substantially vertical sidewall 161a" and the extending direction along the top surface of the first step 160a". The sum of the turning angles θ4, θ5, θ6, θ7, and θ8 is greater than 90°. Similar to the bonding pad 160, in the embodiment shown in FIG. 5, each of the turning angles θ4, θ5, θ6, θ7, and θ8 is substantially equal to 90°. In some embodiments, the horizontal distance between the sidewall 161a" and the sidewall 161b" is different from the horizontal distance between the sidewall 161b" and the sidewall 161c". For example, the horizontal distance between the sidewall 161a" and the sidewall 161b" is greater than the horizontal distance between the sidewall 161b" and the sidewall 161c".

In those cases, the top surface area of the first step 160a" is also greater than the top surface area of the second step 160b".

Figure 6:
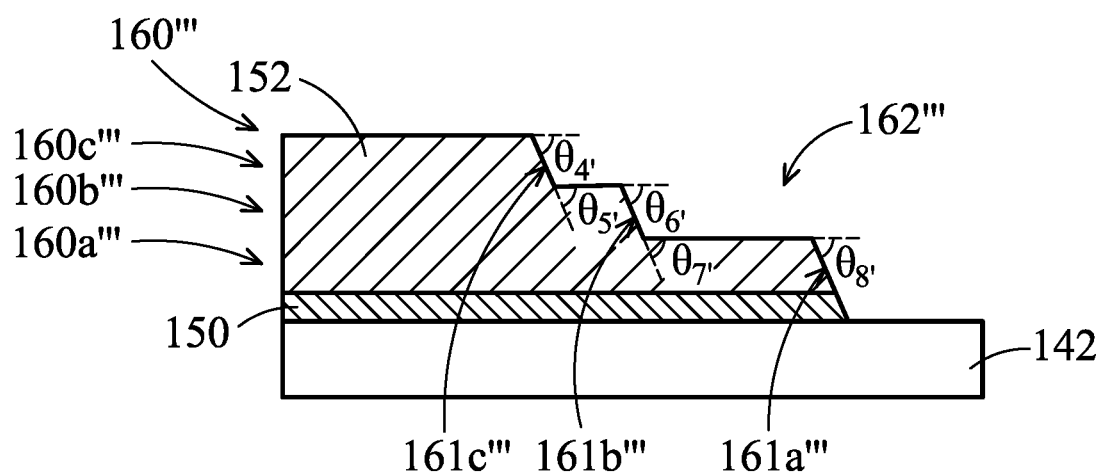
FIG. 6 shows a magnified cross-sectional representation of a portion of a bonding pad, in accordance with some embodiments.

FIG. 6 shows a magnified cross-sectional representation of a portion of the bonding pad 160''', in accordance with some embodiments. In some embodiments, the bonding pad 160 shown in FIG. 1G can be replaced by the bonding pad 160''' shown in FIG. 6. In some embodiments, the structure and the method used for the formation of the bonding pad 160''' is similar to those used for the formation of the bonding pad 160 shown in FIG. 1G. Similar to the bonding pad 160, the multi-step edge (or referred to as the sidewall with a non-straight contour) 162''' of the bonding pad 160''' defines a first step 160a''', a second step 160b''' over the first step 160a''', and a third step 160c''' over the second step 160b'''. In some embodiments, similar to the bonding pad 160' shown in FIG. 4, the first step 160a''' has a tapered (or tilted) sidewall 161a''', the second step 160b''' has a tapered (or tilted) sidewall 161b''' and the third step 160c''' has a tapered (or tilted) sidewall 161c'''.

In those cases, the path (not shown and similar to the path 155 shown in FIG. 3) from the top surface of the bonding pad 160''' to the top surface of the insulating layer 142 along the sidewall with the non-straight contour (i.e., the multi-step edge) 162''' of the bonding pad 160''' includes five corners. Those corners define five turning angles θ4', θ5', θ6', θ7', and θ8'. The turning angle θ4' is an angle between the tapered (or tilted) sidewall 161c''' and the extending direction along the top surface of the third step 160c'''. The turning angle θ5' is an angle between the extending direction along the tapered (or tilted) sidewall 161c''' and the top surface of the second step 160b'''. The turning angle θ6' is an angle between the tapered (or tilted) sidewall 161b''' and the extending direction along the top surface of the second step 160b'''. The turning angle θ7' is an angle between the extending direction along the tapered (or tilted) sidewall 161b''' and the top surface of the first step 160a'''. The turning angle θ8' is an angle between the tapered (or tilted) sidewall 161a''' and the extending direction along the top surface of the first step 160a'''. The sum of the turning angles θ4', θ5', θ6', θ7', and θ8' is greater than 90°. Similar to the bonding pad 160', in the embodiment shown in FIG. 6, each of the turning angles θ4', θ5', θ6', θ7', and θ8' is less than 90°. In some embodiments, the horizontal distance between the sidewall 161a''' and the sidewall 161b''' is different from the horizontal distance between the sidewall 161b''' and the sidewall 161c'''. For example, the horizontal distance between the sidewall 161a''' and the sidewall 161b''' is greater than the horizontal distance between the sidewall 161b''' and the sidewall 161c'''.

In those cases, the top surface area of the first step 160a''' is also greater than the top surface area of the second step 160b'''.

Figure 7:
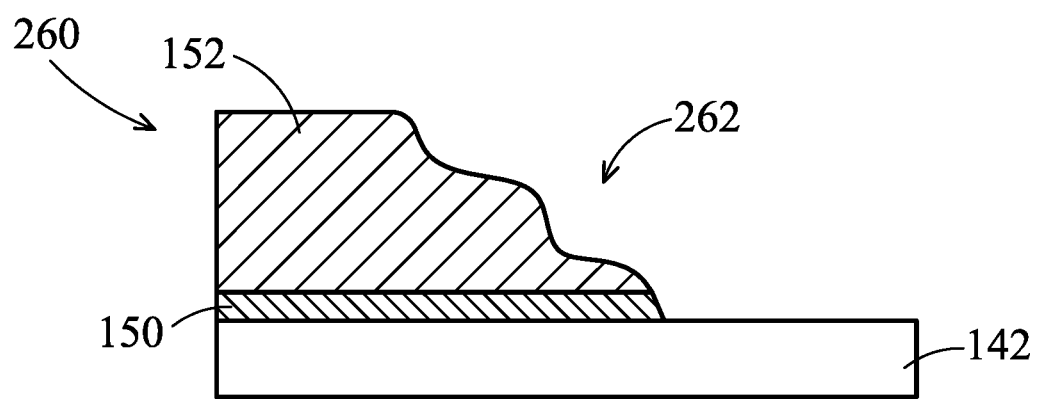
FIG. 7 shows a magnified cross-sectional representation of a portion of a bonding pad, in accordance with some embodiments.

FIG. 7 shows a magnified cross-sectional representation of a portion of the bonding pad 260, in accordance with some embodiments. In some embodiments, the bonding pad 160 shown in FIG. 1G can be replaced by the bonding pad 260 shown in FIG. 7. In some embodiments, the structure and the method used for the formation of the bonding pad 260 are similar to those used for the formation of the bonding pad 160 shown in FIG. 1G. Similar to the bonding pad 160" shown in FIG. 5 or the bonding pad 160''' shown in FIG. 6, the top surface and the sidewall with the multi-step edge (or referred to as the sidewall with a non-straight contour) 262 of the bonding pad 260 define three curved steps. The three curved steps form a curved contour with at least two curved corners (for example, it may have five curved corners). In some embodiments, each curved step has a concave or convex contour, and those concave and convex contours are alternately arranged.

It should be realized that the number of steps defined by the multi-step edge of the bonding pad is based on the design demands and is not limited to the embodiments shown in FIGS. 3 to 7. For example, the multi-step edge of the bonding pad may define more than three steps.

Figure 1H:
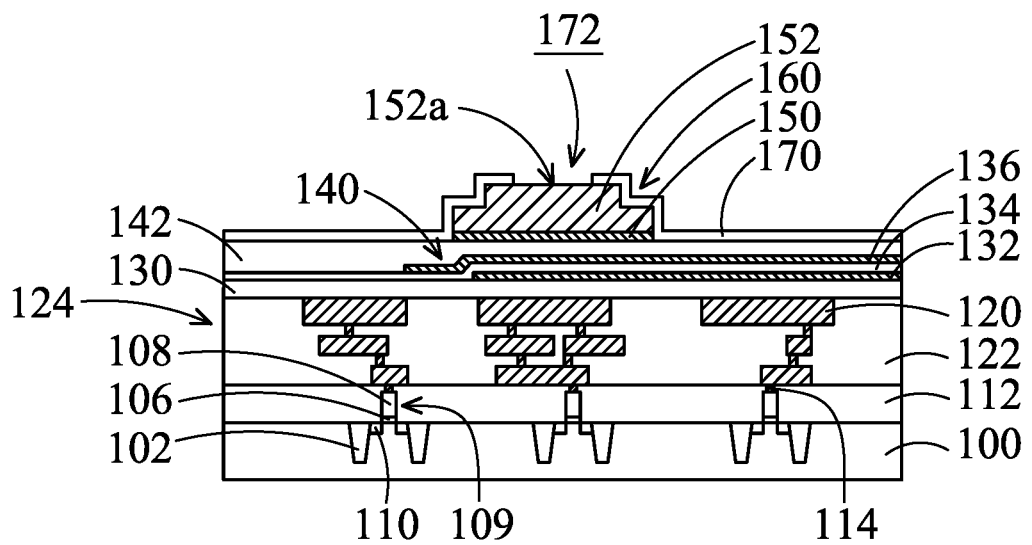

After the patterned masking layer 154 is removed to expose the top surface 152a of the bonding pad 160, an insulating layer 170 (which is also referred to as a passivation layer) conformally covers the top surface 152a and the multi-step edge 162 of the bonding pad 160, as shown in FIG. 1H in accordance with some embodiments. In some embodiments, the conformal insulating layer (or passivation layer) 170 also extends to cover the insulating layer 142. The insulating layer 170 serves as a protection layer for the underlying bonding pad 160 and has an opening 172 to expose a portion of the top surface 152a of the bonding pad 160. In some embodiments, the insulating layer 170 is a single layer or a multi-layer structure. For example, the insulating layer 170 is a multi-layer structure. In this case, the insulating layer 170 includes a USG layer and a silicon nitride ($Si_xN_y$) layer. In order to simplify the diagram, only a single layer is depicted. The formation of the insulating layer 170 includes deposition, photolithography, and etching processes. The deposition processes include CVD, PVD, ALD, or applicable process. The photolithography processes include photoresist coating (e.g., spin-on coating), soft baking, mask aligning, exposure, post-exposure baking, developing photoresist, rinsing and drying (e.g., hard baking). The etching process includes a dry etching process or a wet etching process.

The bonding pads 160, 160', 160", and 160''' shown in FIGS. 3 to 6, respectively, are used to as a stress buffer or a crack-stopper to prevent cracks from expanding into the MIM capacitor 140. In some embodiments, cracks form in the passivation layer (i.e., the insulating layer 170) overlying the bonding pad 160 and the insulating layer 142, and then the cracks penetrate into the underlying insulating layer 142. The thick bonding pad 160, 160', 160", or 160''' exhibits the properties of ductility and malleability since it is made of a metal material. Moreover, the multi-step edge 162, 162', 162", or 162''' provides more surface area to share the stress in the insulating layer 170. Therefore, cracks can stop on the bonding pad 160, 160', 160", or 160'''. As a result, the cracks are difficult to penetrate into the MIM capacitor 140, so that the embedded MIM capacitor 140 is not damaged by the cracks.

Figure 1I:
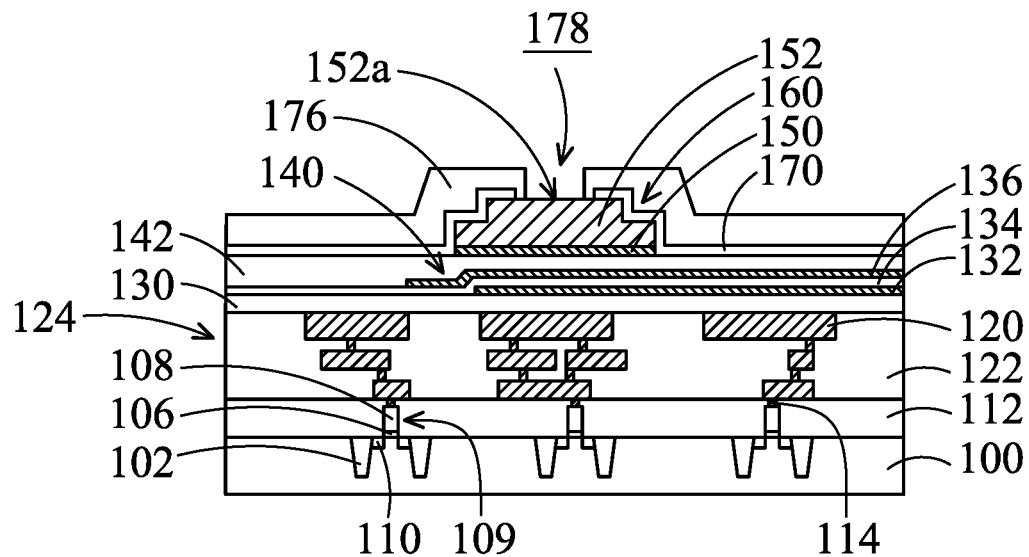

After the insulating layer 170 is formed, an insulating layer 176 is formed over the insulating layer 170, as shown in FIG. 1I in accordance with some embodiments. In some embodiments, the insulating layer 176 also extends into the opening 172 (as indicated in FIG. 1H) of insulating layer 170 and exposes the top surface 152a of the bonding pad 160 via an opening 178 formed therein. The insulating layer 176 also serves as a protection layer for the underlying passivation layer (i.e., the insulating layer 170). The insulating layer 176 may be made of, or include, one or more polymer materials such as polybenzoxazole (PBO), polyimide (PI), one or more other suitable polymer materials, or a combination thereof. The formation of the insulating layer 176 includes deposition, photolithography, and etching processes. The deposition processes include spin-on coating, CVD, or applicable process. The photolithography processes include photoresist coating (e.g., spin-on coating), soft baking, mask aligning, exposure, post-exposure baking, developing photoresist, rinsing and drying (e.g., hard baking). The etching process includes a dry etching process or a wet etching process.

Figure 1J:
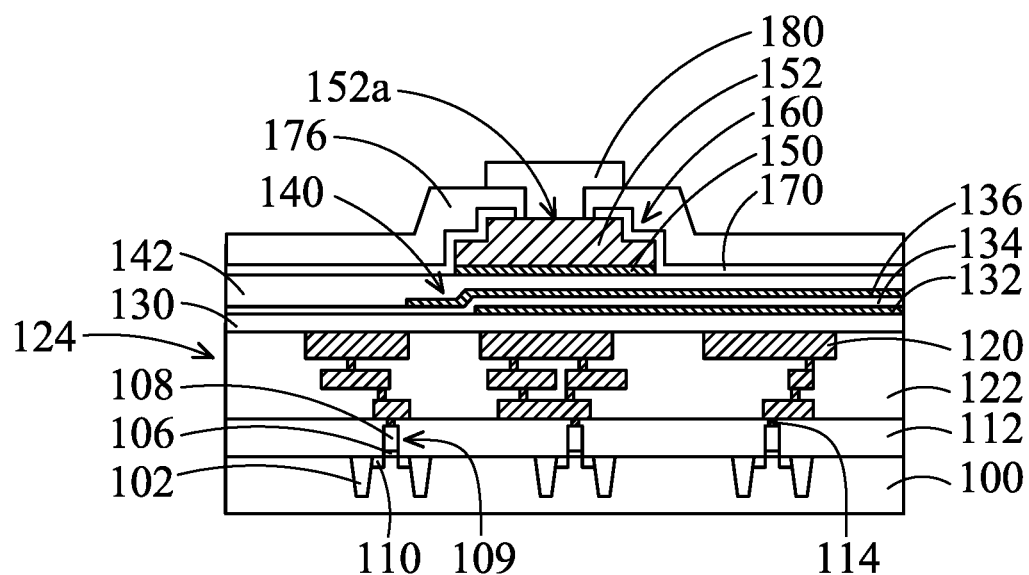

Afterwards, an under bump metallurgy (UBM) layer 180 is formed in the opening 178 (as indicated in FIG. 1I) and over a portion of the insulating layer 176 covering the bonding pad 160, as shown in FIG. 1J in accordance with some embodiments. The UBM layer 180 is in direct contact with the exposed top surface 152 of the bonding pad 160 through the opening 178. The UBM layer 180 may be made of a conductive material, such as copper (Cu), copper alloy, aluminum (Al), aluminum alloy, tungsten (W), tungsten alloy, titanium (Ti), titanium alloy, tantalum (Ta) or tantalum alloy. In addition, the UBM layer 180 may contain an adhesion layer and/or a wetting layer. In some embodiments, the UBM layer 180 further includes a copper seed layer. In some embodiments, the UBM layer 180 includes an adhesion layer made of Ti/Cu and a wetting layer made of Cu. In some embodiments, the UBM layer 180 is formed by a plating process, such as an electrochemical plating process or an electroless process.

Figure 1K:
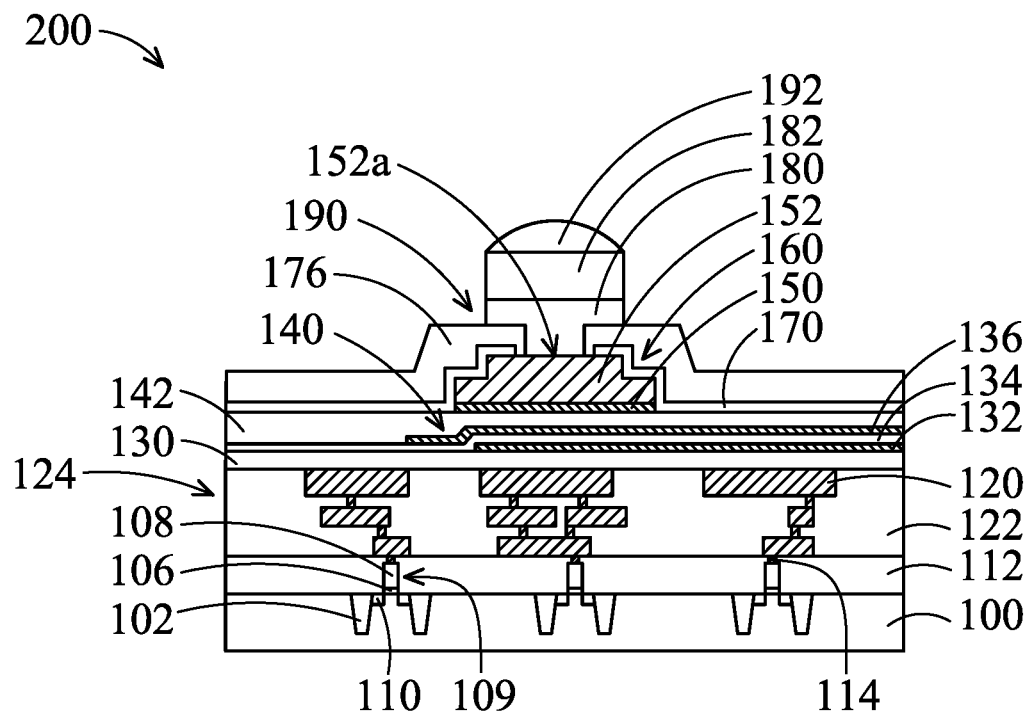

After the UBM layer 180 is formed, a bump 182 is formed over the UBM layer 180 and a solder material region 192 is formed over the bump 182, as shown in FIG. 1K in accordance with some embodiments. The bump 182 and the underlying UBM layer 180 are sometimes collectively referred to as a connector 190. After the solder material region 192 is formed, a semiconductor device structure 200 is formed. The bump 182 is electrically connected to the bonding pad 160 by the UBM layer 180.

In some embodiments, the bump 182 is made of a metal layer, such as copper, copper alloy, nickel, nickel alloy, aluminum, aluminum alloy, tin, tin alloy, lead, lead alloy, silver, silver alloy or a combination thereof. In some embodiments, the bump 182 is formed by a plating process, such as an electrochemical plating process or an electroless process. The solder material region 192 may be formed of a Sn—Ag alloy, a Sn—Ag—Cu alloy, or the like, and may be lead-free or lead-containing. The solder material region 192 may be formed by plating.

Figure 2A:
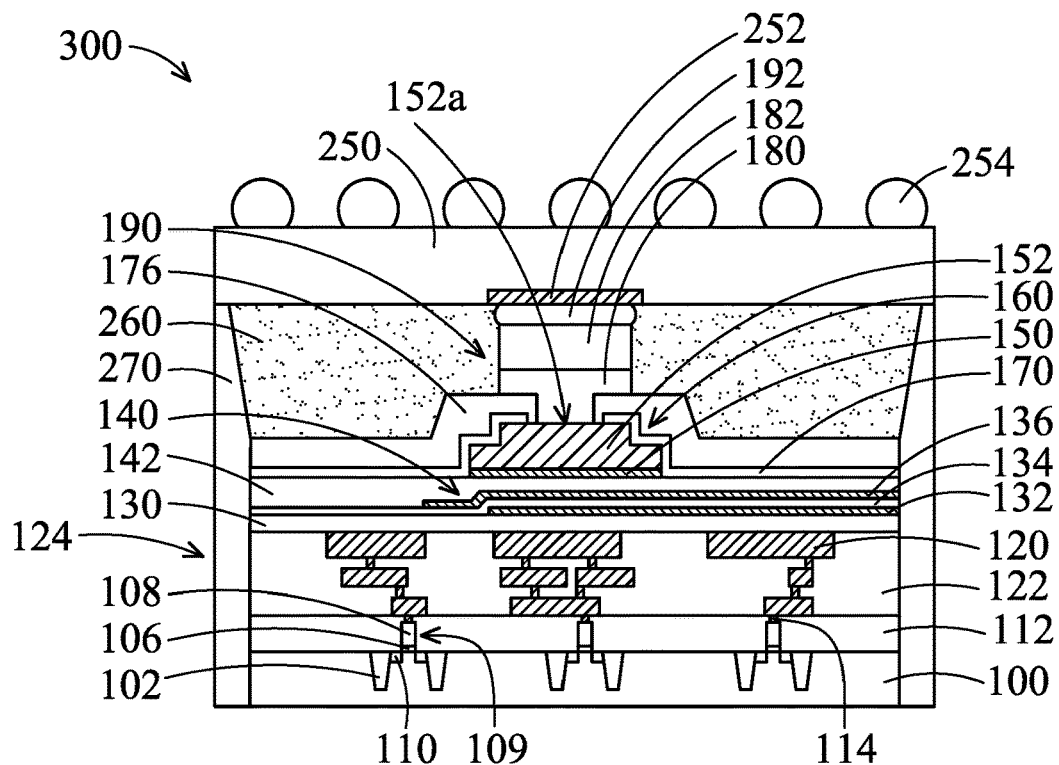
FIG. 2A shows a cross-sectional representation of a package structure, in accordance with some embodiments.

FIG. 2A shows a cross-sectional representation of a package structure 300, in accordance with some embodiments. In some embodiments, the package structure 300 may be a chip-on-wafer-on-substrate (CoWoS) package or another suitable package. In some embodiments, the package structure 300 includes the semiconductor device structure 200 shown in FIG. 1K that is bonded to a conductive feature 252 in a package component 250, which may be an interposer, a package substrate, a package, a device die, a printed circuit board, or the like. In some embodiments, the bonding may be through solder material region 192.

In some embodiments, the package structure 300 further includes an underfill material layer 260 formed in the gap between the semiconductor device structure 200 (as indicated in FIG. 1K) and the package component 250. The underfill material layer 260 may be in direct contact with the top surface of insulting layer 176 of the semiconductor device structure 200, and may contact the sidewalls of connector 190 of the semiconductor device structure 200 to protect the connector 190. Moreover, an encapsulating layer 270 is formed over the underfill material layer 260. The encapsulating layer 270 surrounds and protects the semiconductor device structure 200.

In some embodiments, the underfill material layer 260 is made of a polymer material. For example, the underfill material layer 260 may include an epoxy-based resin. In some embodiments, the underfill material layer 260 includes fillers dispersed in the epoxy-based resin. In some embodiments, the formation of the underfill material layer 260 involves an injecting process, a spin-on process, a dispensing process, a film lamination process, an application process, one or more other applicable processes, or a combination thereof. In some embodiments, a thermal curing process is used during the formation of the underfill material layer 260.

The encapsulating layer 270 is made of a molding compound material. The molding compound material may include a polymer material, such as an epoxy-based resin with fillers dispersed therein. In some embodiments, a liquid molding compound material is applied over the semiconductor device 200. A thermal process is then used to cure the liquid molding compound material and to transform it into the encapsulating layer 270.

In some embodiments, the package structure 300 further includes connectors 254, such as a solder ball, formed over the package component 250 and opposite the underfill material layer 260.

The semiconductor device 200 and the package component 250 in the package structure 300 have different coefficients of thermal expansion (CTE), and cracks are formed due to the CTE mismatch. In some embodiments, the cracks are generated in the insulating layer 170 (i.e., the passivation layer), and then the cracks penetrate the insulating layer 170. If the bonding pad without a multi-step edge (or a sidewall with a non-straight contour) is formed over the MIM capacitor 140, the cracks may penetrate into the layers in the MIM capacitor 140 and the layers of the MIM capacitor 140 may be delaminated. In order to stop the expansion of the cracks, the bonding pad 160 with a multi-step edge 162 is formed between the insulating layer 170 and the MIM capacitor 140. Therefore, the embedded MIM capacitor 140 is not damaged by the cracks, and the quality, yield, and reliability of the package structure 300 are improved.

Figure 2B:
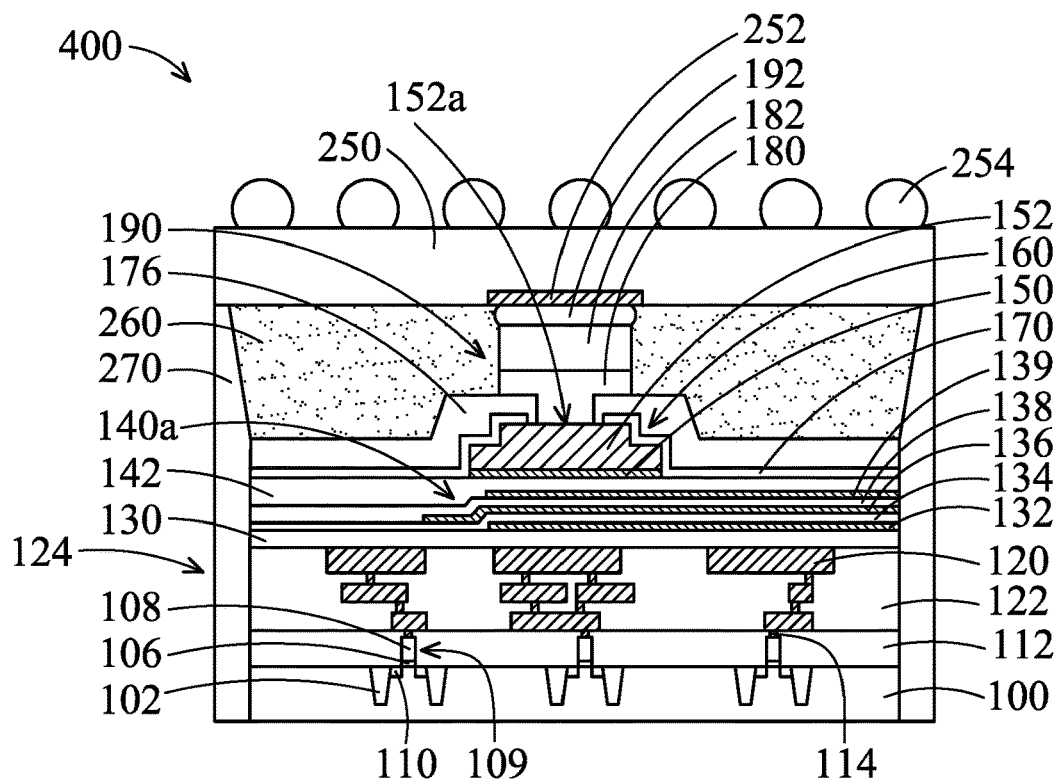
FIG. 2B shows a cross-sectional representation of a package structure, in accordance with some embodiments.

FIG. 2B shows a cross-sectional representation of a package structure 400, in accordance with some embodiments. Some processes and materials used for the formation of the package structure 400 are similar to, or the same as those used for the formation of the package structure 300 shown in FIG. 2A and are not repeated herein. The structure of the package structure 400 is similar to the structure of the package structure 300. Unlike the package structure 300, the package structure 400 includes a capacitor structure constructed by a capacitor metal electrode layer 132, a capacitor insulating layer 134, a capacitor metal electrode layer 136, a capacitor insulating layer 138, and a capacitor metal electrode layer 139, in which the capacitor insulating layer is formed over the capacitor metal electrode layer 136, and the capacitor metal electrode layer 139 is formed over the capacitor insulating layer 138. The capacitor structure includes two stacking MIM capacitors, and sometimes is referred to as a super high density MIM capacitor (SHD-MIM) 140a.

In some other embodiments, the SHDMIM 140a includes more than two MIM capacitors that are stacked between the interconnect structure 124 and the bonding pad 160 and embedded in the passivation layer including the insulating layers 130 and 142.

Embodiments of a semiconductor device structure and method for formation of the same are provided. The semiconductor device structure includes a capacitor structure embedded in a first insulating layer. A bonding pad having a multi-step edge is formed over the first insulating layer and corresponds to the capacitor structure. A second insulating layer conformally covers the top surface and the multi-step edge of the bonding pad. The multi-step edge of the bonding pad provides more surface area to share the stress in the second insulating layer. As a result, the bonding pad with the multi-step edge can be used as a stress buffer or a crack-stopper to prevent cracks from expanding or penetrating into the capacitor structure below the bonding pad. Since the capacitor structure is protected by the bonding pad with the multi-step edge to reduce or prevent the cracks, the quality, yield, and reliability of the semiconductor device structure are improved.

In some embodiments, a semiconductor device structure is provided. The semiconductor device structure includes a first insulating layer formed over a conductive feature, and a capacitor structure embedded in the first insulating layer. The semiconductor device also includes a bonding pad formed over the first insulating layer and corresponding to the capacitor structure. The bonding pad has a top surface and a multi-step edge to form at least three corners. In addition, the semiconductor device structure includes a second insulating layer conformally covering the at least three corners formed by the top surface and the multi-step edge of the bonding pad.

In some embodiments, a semiconductor device structure is provided. The semiconductor device structure includes a first insulating layer formed over an uppermost metal layer of an interconnect structure, and a metal-insulator-metal capacitor embedded in the first insulating layer. The semiconductor device structure also includes a bonding pad formed above the metal-insulator-metal capacitor and isolated from the metal-insulator-metal capacitor by the first insulating layer. The bonding pad has a sidewall with a non-straight contour. A path from a top surface of the bonding pad to a top surface of the first insulating layer along the sidewall of the bonding pad includes at least three turning angles. A sum of the turning angles is greater than 90°

In some embodiments, a method for forming a semiconductor device structure is provided. The method includes forming a first insulating layer and a metal-insulator-metal capacitor over an uppermost metal layer of an interconnect structure. The metal-insulator-metal capacitor is embedded in the first insulating layer. The method also includes forming a conductive layer over the first insulating layer, and patterning the conductive layer to form a bonding pad over the first insulating layer and corresponding to the metal-insulator-metal capacitor. The bonding pad has a multi-step edge. The method further includes conformally forming a second insulating layer to cover a top surface and the multi-step edge of the bonding pad. In addition, the method includes forming a third insulating layer over the second insulating layer. The method further includes forming an under bump metallization layer over the third insulating layer and passing through the third insulating layer and the second insulating layer to contact the top surface of the bonding pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
    a first insulating layer formed over a conductive feature;
    a capacitor structure embedded in the first insulating layer;
    a bonding pad formed over the first insulating layer and corresponding to the capacitor structure, wherein the bonding pad has a top surface and a multi-step edge to form at least three corners; and
    a second insulating layer conformally covering the at least three corners formed by the top surface and the multi-step edge of the bonding pad.

2. The semiconductor device structure as claimed in claim 1, further comprising:
    a third insulating layer formed over the second insulating layer; and
    an under bump metallization layer formed over the third insulating layer and passing through the third insulating layer and the second insulating layer to contact the top surface of the bonding pad.

3. The semiconductor device structure as claimed in claim 1, wherein the multi-step edge of the bonding pad defines a first step and a second step over the first step, and wherein the first step and the second step each have a substantially vertical sidewall.

4. The semiconductor device structure as claimed in claim 1, wherein the multi-step edge of the bonding pad defines a first step and a second step over the first step, and wherein the first step and the second step each have a tapered sidewall.

5. The semiconductor device structure as claimed in claim 1, wherein the multi-step edge of the bonding pad defines a first step, a second step over the first step, and a third step over the second step, and wherein the first step, the second step, and the third step each have a substantially vertical sidewall.

6. The semiconductor device structure as claimed in claim 5, wherein a top surface area of the first step is different from a top surface area of the second step.

7. The semiconductor device structure as claimed in claim 1, wherein the multi-step edge of the bonding pad forms a curved contour including at least two corners.

8. The semiconductor device structure as claimed in claim 1, wherein the capacitor structure is a metal-insulator-metal capacitor and comprises:

a first capacitor metal electrode layer;
a first capacitor insulating layer formed over the first capacitor metal electrode layer; and
a second capacitor metal electrode layer formed over the first capacitor insulating layer.

9. The semiconductor device structure as claimed in claim 8, further comprising:
a second capacitor insulating layer formed over the second capacitor metal electrode layer; and
a third capacitor metal electrode layer formed over the second capacitor insulating layer.

10. The semiconductor device structure as claimed in claim 1, wherein the conductive feature is an uppermost metal layer of an interconnect structure.

11. A semiconductor device structure, comprising:
a first insulating layer formed over an uppermost metal layer of an interconnect structure;
a metal-insulator-metal capacitor embedded in the first insulating layer; and
a bonding pad formed above the metal-insulator-metal capacitor and isolated from the metal-insulator-metal capacitor by the first insulating layer, wherein the bonding pad has a sidewall with a non-straight contour, wherein a path from a top surface of the bonding pad to a top surface of the first insulating layer along the sidewall of the bonding pad includes at least three corners to correspondingly define at least three turning angles at the sidewall of the bonding pad.

12. The semiconductor device structure as claimed in claim 11, further comprising:
a second insulating layer conformally covering a top surface and the sidewall of the bonding pad;
a third insulating layer formed over the second insulating layer; and
an under bump metallization layer formed over the third insulating layer and passing through the third insulating layer and the second insulating layer to contact the top surface of the bonding pad.

13. The semiconductor device structure as claimed in claim 11, wherein each of the turning angles is substantially equal to 90°.

14. The semiconductor device structure as claimed in claim 11, wherein each of the turning angles is less than 90°.

15. The semiconductor device structure as claimed in claim 11, wherein the sidewall with the non-straight contour forms a first step, a second step over the first step, and a third step over the second step, and wherein a top surface area of the first step is greater than a top surface area of the second step.

16. The semiconductor device structure as claimed in claim 11, wherein the non-straight contour is a curved contour.

17. The semiconductor device structure as claimed in claim 11, wherein a sum of the at least turning angles is greater than 90°.

18. A semiconductor device structure, comprising:
an interconnect structure over a gate structure;
a capacitor structure over the interconnect structure;
a bonding pad over the capacitor structure, wherein the bonding pad has a first step and a second step over the first step, the first step includes a first sidewall and a first top surface over the first sidewall, and the second step includes a second sidewall in contact with the first top surface and a second top surface over the second sidewall; and
an insulating layer conformally covering the first step and the second step of the bonding pad.

19. The semiconductor device structure as claimed in claim 18, wherein the bonding pad is electrically connected to the capacitor structure through a via.

20. The semiconductor device structure as claimed in claim 18, wherein the capacitor structure is a metal-insulator-metal capacitor and comprises:
a first capacitor metal electrode layer;
a first capacitor insulating layer over the first capacitor metal electrode layer, wherein the first capacitor insulating layer has a lower horizontal portion, an upper horizontal portion, and a vertical portion between the lower horizontal portion and the upper horizontal portion; and
a second capacitor metal electrode layer over the first capacitor insulating layer.

* * * * *